(12) United States Patent
Mishima et al.

(10) Patent No.: US 11,878,487 B2
(45) Date of Patent: Jan. 23, 2024

(54) POROUS RESIN FILM FOR METAL LAYER LAMINATE BOARD AND METAL LAYER LAMINATE BOARD

(71) Applicant: NITTO DENKO CORPORATION, Ibaraki (JP)

(72) Inventors: Kei Mishima, Ibaraki (JP); Naoto Nagami, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 17/723,545

(22) Filed: Apr. 19, 2022

(65) Prior Publication Data
US 2022/0332090 A1    Oct. 20, 2022

(30) Foreign Application Priority Data

Apr. 19, 2021    (JP) ................... 2021-070654

(51) Int. Cl.
    *B32B 3/10*        (2006.01)
    *B32B 15/01*      (2006.01)
                  (Continued)

(52) U.S. Cl.
CPC .............. *B32B 15/01* (2013.01); *B32B 3/266* (2013.01); *B32B 15/20* (2013.01); *C08J 9/122* (2013.01); *C09D 151/08* (2013.01); *B32B 2255/06* (2013.01); *B32B 2255/26* (2013.01); *B32B 2307/202* (2013.01); *B32B 2457/00* (2013.01);
(Continued)

(58) Field of Classification Search
None
See application file for complete search history.

(56) References Cited

U.S. PATENT DOCUMENTS

| | | | |
|---|---|---|---|
| 5,457,079 A | 10/1995 | Itabashi et al. | |
| 2008/0057299 A1 | 3/2008 | Adachi et al. | |
| 2020/0032026 A1* | 1/2020 | Nakamura | ............... C08J 9/286 |

FOREIGN PATENT DOCUMENTS

| | | |
|---|---|---|
| JP | H6-34450 A | 2/1994 |
| JP | H6-99070 A | 4/1994 |
| | (Continued) | |

OTHER PUBLICATIONS

Extended European Search Report dated Sep. 13, 2022, for corresponding European Patent Application No. 22168556.3, 9 pages.

*Primary Examiner* — Christopher M Polley
(74) *Attorney, Agent, or Firm* — Hauptman Ham, LLP

(57) ABSTRACT

A porous resin film for a metal layer laminate board and a metal layer laminate board are provided to suppress damage to a metal layer disposed on an inner peripheral surface of a through hole and to have excellent electrical connection reliability even under the high temperature environment. The porous resin film for a metal layer laminate board is used in lamination of a metal layer. The porous resin film for a metal layer laminate board has a minimum thermal expansion coefficient X in a plane direction perpendicular to a thickness direction and a thermal expansion coefficient Z in the thickness direction. In the porous resin film for a metal layer laminate board, a ratio (Z/X) of the thermal expansion coefficient Z in the thickness direction to the minimum thermal expansion coefficient X is 3.5 or less.

2 Claims, 1 Drawing Sheet

(51) Int. Cl.
*B32B 3/26* (2006.01)
*B32B 15/20* (2006.01)
*C08J 9/12* (2006.01)
*C09D 151/08* (2006.01)
*H05K 1/02* (2006.01)

(52) U.S. Cl.
CPC ....... *B32B 2457/08* (2013.01); *C08J 2351/08* (2013.01); *H05K 1/0277* (2013.01)

(56) References Cited

FOREIGN PATENT DOCUMENTS

| | | |
|---|---|---|
| JP | 2003-165715 A | 6/2003 |
| JP | 2011-167905 A | 9/2011 |
| WO | 2018/186486 A1 | 11/2018 |

* cited by examiner

POROUS RESIN FILM FOR METAL LAYER LAMINATE BOARD AND METAL LAYER LAMINATE BOARD

CROSS-REFERENCE TO RELATED APPLICATION

The present application claims priority from Japanese Patent Application No. 2021-070654 filed on Apr. 19, 2021, the contents of which are hereby incorporated by reference into this application.

TECHNICAL FIELD

The present invention relates to a porous resin film for a metal layer laminate board and a metal layer laminate board.

BACKGROUND ART

It has been known that a polyimide porous film is used for a copper layer laminate board (ref: for example, Patent Document 1 below). A copper-coated laminate board includes a polyimide porous film having a through hole, a copper layer laminated on both surfaces in a thickness direction thereof, and a copper plating portion which electrically connects the polyimide porous film to the copper layer and is disposed on an inner peripheral surface of the through hole. In the copper-coated laminate board, the copper layer is formed into a pattern by etching to be electrically connected to another substrate.

CITATION LIST

Patent Document

Patent Document 1: WO2018/186486

SUMMARY OF THE INVENTION

Problem to be Solved by the Invention

When the pattern consisting of the copper layer of Patent Document 1 is electrically connected to the other substrate by reflow, the copper plating portion is likely to be damaged. In this case, there is a problem that electrical connection reliability between the patterns disposed on both surfaces of the polyimide porous film decreases.

The present invention provides a porous resin film for a metal layer laminate board, and a metal layer laminate board capable of suppressing damage to a metal layer disposed on an inner peripheral surface of a through hole and having excellent electrical connection reliability even under the high temperature environment.

Means for Solving the Problem

The present invention (1) includes a porous resin film for a metal layer laminate board used in lamination of a metal layer having a minimum thermal expansion coefficient X in a plane direction perpendicular to a thickness direction and a thermal expansion coefficient Z in the thickness direction, wherein a ratio (Z/X) of the thermal expansion coefficient Z in the thickness direction to the minimum thermal expansion coefficient X is 3.5 or less.

In the porous resin film for a metal layer laminate board, since the ratio (Z/X) of the thermal expansion coefficient Z in the thickness direction to the minimum thermal expansion coefficient X is as low as 3.5 or less, it is possible to suppress a stress applied to the metal layer disposed on the inner peripheral surface of the through hole under the high temperature environment. Therefore, it is possible to suppress the above-described damage to the metal layer. As a result, it is possible to produce the metal layer laminate board having excellent electrical connection reliability.

The present invention (2) includes a metal layer laminate board including the porous resin film for a metal layer laminate board having a through hole penetrating in a thickness direction and described in (1) and a metal layer disposed on one surface and the other surface in the thickness direction of the porous resin film for a metal layer laminate board and an inner peripheral surface of the through hole.

In the metal layer laminate board, the damage to the metal layer is suppressed. Therefore, the metal layer laminate board has excellent electrical connection reliability.

Effect of the Invention

The porous resin film for a metal layer laminate board and the metal layer laminate board of the present invention are capable of suppressing damage to a metal layer disposed on an inner peripheral surface of a through hole, and have excellent electrical connection reliability even under the high temperature environment.

DESCRIPTION OF EMBODIMENTS

Figure 1:
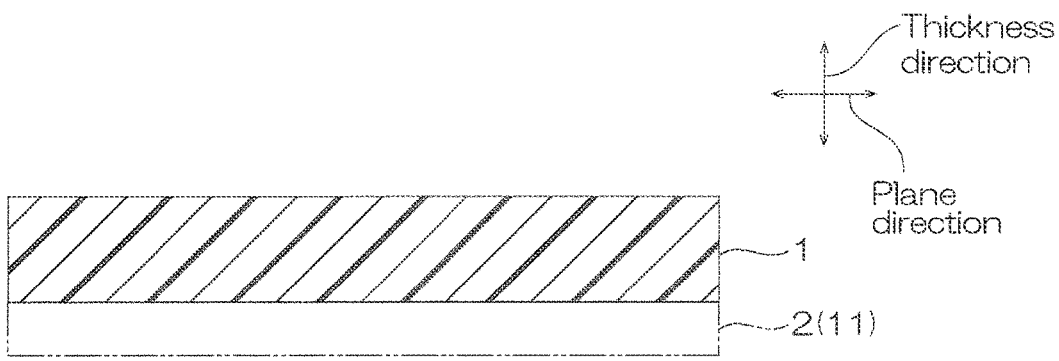
FIG. 1 shows a cross-sectional view of one embodiment of a porous resin film for a metal layer laminate board of the present invention.

One embodiment of a porous resin film for a metal layer laminate board of the present invention is described with reference to FIG. 1. As shown in FIG. 1, a porous resin film 1 for a metal layer laminate board has a thickness and extends in a plane direction perpendicular to a thickness direction. The thickness of the porous resin film 1 for a metal layer laminate board is not particularly limited. The porous resin film 1 for a metal layer laminate board has a thickness of, for example, 2 μm or more, preferably 5 μm or more, and for example, 1000 μm or less, preferably 500 μm or less.

<Thermal Expansion Coefficient>

The porous resin film 1 for a metal layer laminate board has a minimum thermal expansion coefficient X in the plane direction, and a thermal expansion coefficient Z in the thickness direction.

The minimum thermal expansion coefficient X is the lowest thermal expansion coefficient of any direction in the plane direction. The minimum thermal expansion coefficient X is not particularly limited as long as a ratio (Z/X) to be described later is satisfied. The minimum thermal expansion coefficient X is, for example, 30.0 ppm/K or less, preferably 25.0 ppm/K or less. A lower limit of the minimum thermal expansion coefficient X is not particularly limited. The lower limit of the minimum thermal expansion coefficient X is, for example, 1 ppm/K and 10 ppm/K. A method for measuring the minimum thermal expansion coefficient X is described in Examples later.

The thermal expansion coefficient Z in the thickness direction is not particularly limited as long as the ratio (Z/X) to be described later is satisfied. The thermal expansion coefficient Z in the thickness direction is, for example, larger than the above-described minimum thermal expansion coefficient X. Specifically, the thermal expansion coefficient Z in the thickness direction is, for example, 100 ppm/K or less, preferably 90 ppm/K or less, more preferably 80 ppm/K or less, further more preferably 70 ppm/K or less, particularly preferably 60 ppm/K or less. When the thermal expansion coefficient Z in the thickness direction is the above-described upper limit or less, the ratio (Z/X) to be described later can be set within a desired range, that is, a lower ratio (Z/X). The lower limit of the thermal expansion coefficient Z in the thickness direction is not particularly limited. The lower limit of the thermal expansion coefficient Z in the thickness direction is, for example, 1 ppm/K and 10 ppm/K. A method for measuring the thermal expansion coefficient Z in the thickness direction is described in Examples later.

The ratio (Z/X) of the thermal expansion coefficient Z in the thickness direction to the minimum thermal expansion coefficient X is 3.5 or less.

When the ratio (Z/X) of the thermal expansion coefficient Z in the thickness direction to the minimum thermal expansion coefficient X is above 3.5, expansion in the thickness direction of the porous resin film 1 for a metal layer laminate board with respect to the expansion in the plane direction of the porous resin film 1 for a metal layer laminate board at high temperature is excessive. Therefore, when an electrically conductive portion 5 is formed in a through hole 9 of a metal layer laminate board 10 including the porous resin film 1 for a metal layer laminate board having the through hole 9, and the metal layer laminate board 10 is under the high temperature environment, the above-described electrically conductive portion 5 is damaged. Therefore, electrical connection reliability of the metal layer laminate board 10 decreases. In other words, in the porous resin film 1 for a metal layer laminate board, since the ratio (Z/X) of the thermal expansion coefficient Z in the thickness direction to the minimum thermal expansion coefficient X is as small as 3.5 or less, it is possible to suppress the expansion in the thickness direction of the porous resin film 1 for a metal layer laminate board with respect to the expansion in the plane direction of the porous resin film 1 for a metal layer laminate board at high temperature. Therefore, even when the above-described metal layer laminate board 10 is under the high temperature environment, it is possible to suppress the above-described damage to the electrically conductive portion 5. Therefore, it is possible to suppress a decrease in the electrical connection reliability of the metal layer laminate board 10.

The ratio (Z/X) of the thermal expansion coefficient Z in the thickness direction to the minimum thermal expansion coefficient X is preferably 3.0 or less. Also, a lower limit of the ratio (Z/X) of the thermal expansion coefficient Z in the thickness direction to the minimum thermal expansion coefficient X is not particularly limited. The lower limit of the ratio (Z/X) of the thermal expansion coefficient Z in the thickness direction to the minimum thermal expansion coefficient X is, for example, 1, for example, 1.5, and furthermore 2.0.

The porous resin film 1 for a metal layer laminate board is porous. The porous resin film 1 for a metal layer laminate board has a closed cell and/or an open cell.

The porous resin film 1 for a metal layer laminate board has a porosity of, for example, 50% or more, preferably 60% or more, more preferably 70% or more, further more preferably 80% or more. Also, the porous resin film 1 for a metal layer laminate board has the porosity of, for example, below 100%, furthermore 99% or less. A method for measuring the porosity of the porous resin film 1 for a metal layer laminate board is described in Examples later.

The porosity in the porous resin film 1 for a metal layer laminate board is adjusted in accordance with a kind and/or a mixing amount of a porosity forming agent (described later).

The porous resin film 1 for a metal layer laminate board has a dielectric constant at a frequency of 60 GHz of, for example, 2.5 or less, preferably 1.9 or less, more preferably 1.6 or less, and for example, above 1.0. The dielectric constant of the porous resin film 1 for a metal layer laminate board is measured by a resonant method using a frequency of 60 GHz.

The porous resin film 1 for a metal layer laminate board has a dielectric loss tangent at a frequency of 60 GHz of, for example, 0.006 or less, and for example, above 0. The dielectric loss tangent of the porous resin film 1 for a metal layer laminate board is measured by the resonant method using a frequency of 60 GHz.

An example of a material for the porous resin film 1 for a metal layer laminate board includes a thermosetting resin.

Examples of the thermosetting resin include polycarbonate resins, polyimide resins, fluoride polyimide resins, epoxy resins, phenol resins, urea resins, melamine resins, diallyl phthalate resins, silicone resins, thermosetting urethane resins, fluororesins (polymers of fluorine-containing olefin (specifically, polytetrafluoroethylenes (PTFE)), and liquid crystal polymers (LCP). These may be used alone or in combination of two or more.

Of the above-described resins, from the viewpoint of mechanical strength, preferably, a polyimide resin is used. Details including properties and a producing method of the polyimide resin are, for example, described in WO2018/186486.

The porous resin film 1 for a metal layer laminate board may have a skin layer (not shown) formed on one surface and the other surface in the thickness direction thereof.

Next, a method for producing the porous resin film 1 for a metal layer laminate board is described.

Figure 2:
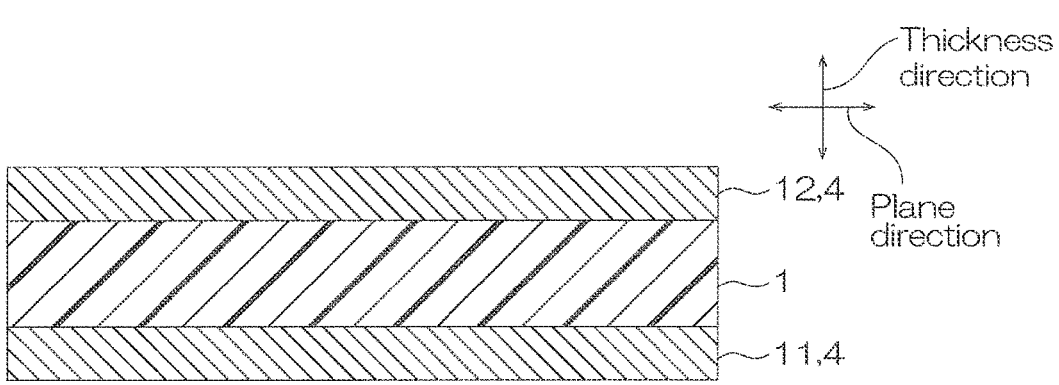
FIG. 2 shows a cross-sectional view of a metal layer laminate board which includes the porous resin film for a metal layer laminate board shown in FIG. 1 and in which a through hole is not yet formed.

Specifically, first, a substrate film 2 shown by a phantom line is prepared. The substrate film 2 extends in the plane direction. Examples of a material for the substrate film 2 include metals and resins. Preferably, since the substrate film 2 may be diverted to a first metal layer 11 (ref: FIG. 2) in the metal layer laminate board 10, a metal is used. Examples of the metal include copper, iron, silver, gold, aluminum, nickel, and alloys of these (stainless steel and bronze). As the metal, preferably, copper is used. The substrate film 2 has a thickness of, for example, 0.1 μm or more, preferably 1 μm or more, and for example, 100 μm or less, preferably 50 μm or less.

Next, a varnish containing a precursor of the above-described resin, a porosity forming agent, a nucleating agent, and a solvent is prepared, and then, the varnish is applied to one surface in the thickness direction of the substrate film 2 to form a coating film. A kind, a mixing ratio, and the like of the porosity forming agent, the nucleating agent, and the solvent in the varnish are, for example, described in WO2018/186486. In particular, the number of parts by mass (mixing ratio) of the porosity forming agent is preferably 20 parts by mass or more, more preferably 100 parts by mass or more, and preferably 300 parts by mass or less, more preferably 250 parts by mass or less with respect to 100 parts by mass of the precursor.

A case where the resin is a polyimide resin is described. The precursor of the polyimide resin is, for example, a reaction product of a diamine component and an acid dianhydride component. Examples of the diamine component include aromatic diamines, aliphatic diamines, and alicyclic diamines. As the diamine component, preferably, an aromatic diamine is used.

Examples of the aromatic diamine include first diamines, second diamines, and third diamines.

The first diamine includes a single aromatic ring. Examples of the first diamine include phenylenediamines, dimethylbenzenediamines, and ethylmethylbenzenediamines From the viewpoint of mechanical strength, preferably, a phenylenediamine is used. Examples of the phenylenediamine include o-phenylenediamines, m-phenylenediamines, and p-phenylenediamines. As the phenylenediamine, preferably, a p-phenylenediamine is used.

The second diamine includes a plurality of aromatic rings and an ether bond disposed between them. An example of the second diamine includes an oxydianiline. Examples of the oxydianiline include 3,4'-oxydianiline and 4,4'-oxydianiline. From the viewpoint of mechanical strength, preferably, a 4,4'-oxydianiline is used.

The third diamine includes a plurality of aromatic rings and an ester bond disposed between them. The third diamine is a component which lowers the above-described ratio (Z/X) of the thermal expansion coefficient in the porous resin film 1 for a metal layer laminate board. An example of the third diamine includes an aminophenylaminobenzoate, and preferably, a 4-aminophenyl-4-aminobenzoate is used.

In addition to the first diamine to the third diamine, examples of the aromatic diamine include 4,4'-methylenedianiline, 4,4'-dimethylenedianiline, 4,4'-trimethylenedianiline, and bis(4-aminophenyl)sulfone.

The above-described diamine components may be used alone or in combination. As the diamine component, preferably, a combination of a first diamine, a second diamine, and a third diamine is used. More preferably, a combination of a p-phenylenediamine, a 4,4'-oxydianiline, and a 4-aminophenyl-4-aminobenzoate is used.

In addition, the p-phenylenediamine may be abbreviated as PDA, and the 4,4'-oxydianiline (also known as 4,4'-diaminophenyl ether) may be abbreviated as ODA. The 4-aminophenyl-4-aminobenzoate may be abbreviated as APAB.

A mole fraction of the first diamine in the diamine component is, for example, 10 mol % or more, preferably 20 mol % or more, and for example, 70 mol % or less, preferably 65 mol % or less. A mole fraction of the second diamine in the diamine component is, for example, 5 mol % or more, preferably 10 mol % or more, and for example, 40 mol % or less, preferably 30 mol % or less. A mole fraction of the third diamine in the diamine component is, for example, 5 mol % or more, preferably 10 mol % or more, and for example, 40 mol % or less, preferably 30 mol % or less.

<Acid Dianhydride Component>

The acid dianhydride component contains, for example, an acid dianhydride including an aromatic ring. An example of the acid dianhydride including an aromatic ring includes an aromatic tetracarboxylic acid dianhydride. Examples of the aromatic tetracarboxylic acid dianhydride include benzenetetracarboxylic acid dianhydride, benzophenone tetracarboxylic acid dianhydride, biphenyltetracarboxylic acid dianhydride, biphenylsulfone tetracarboxylic acid dianhydride, and naphthalenetetracarboxylic acid dianhydride.

An example of the benzenetetracarboxylic acid dianhydride includes a benzene-1,2,4,5-tetracarboxylic acid dianhydride (also known as pyromellitic acid dianhydride). An example of the benzophenone tetracarboxylic acid dianhydride includes a 3,3'-4,4'-benzophenone tetracarboxylic acid dianhydride. Examples of the biphenyltetracarboxylic acid dianhydride include 3,3'-4,4'-biphenyltetracarboxylic acid dianhydride, 2,2'-3,3'-biphenyltetracarboxylic acid dianhydride, 2,3,3',4'-biphenyltetracarboxylic acid dianhydride, and 3,3',4,4'-diphenylethertetracarboxylic acid dianhydride. An example of the biphenylsulfone tetracarboxylic acid dianhydride includes a 3,3',4,4'-biphenylsulfone tetracarboxylic acid dianhydride. Examples of the naphthalenetetracarboxylic acid dianhydride include 2,3,6,7-naphthalenetetracarboxylic acid dianhydride, 1,2,5,6-naphthalenetetracarboxylic acid dianhydride, 1,2,4,5-naphthalenetetracarboxylic acid dianhydride, and 1,4,5,8-naphthalenetetracarboxylic acid dianhydride. These may be used alone or in combination. As the acid dianhydride component, from the viewpoint of mechanical strength, preferably, a biphenyltetracarboxylic acid dianhydride is used, more preferably, a 3,3'-4,4'-biphenyltetracarboxylic acid dianhydride is used. The 3,3'-4,4'-biphenyltetracarboxylic acid dianhydride may be abbreviated as BPDA.

A ratio of the diamine component to the acid dianhydride component is adjusted so that a mole amount of amino groups ($-NH_2$) of the diamine component and a mole amount of acid anhydride groups ($-CO-O-CO-$) of the acid dianhydride component are, for example, an equal amount.

To prepare the precursor of the polyimide resin, the above-described diamine component, the above-described acid dianhydride component, and a solvent are blended to prepare a varnish, and the varnish is heated to prepare a precursor solution. Subsequently, a nucleating agent and a porosity forming agent are blended into the precursor solution to prepare a porous precursor solution. Thereafter, the porous precursor solution is applied to one surface in the thickness direction of the substrate film 2 to form a coating film.

Thereafter, the coating film is dried by heating to form a precursor film. By the above-described heating, the precursor film having a phase separation structure of a polyimide resin precursor and the porosity forming agent with the nucleating agent as a core is prepared, while the removal of the solvent proceeds.

Thereafter, for example, the porosity forming agent is extracted (pulled out or removed) from the precursor film by a supercritical extraction method using supercritical carbon dioxide as a solvent.

Thereafter, the precursor film is cured by heating to form the porous resin film 1 for a metal layer laminate board made of the polyimide resin. The other surface in the thickness direction of the porous resin film 1 for a metal layer laminate board is in contact with the substrate film 2.

Thereafter, if necessary, as shown by a solid line of FIG. 1. the substrate film 2 is removed. For example, when the material for the substrate film 2 is a metal, the substrate film 2 is dissolved using a stripping solution. An example of the stripping solution includes $FeCl_3$. Thus, the porous resin film 1 for a metal layer laminate board is obtained.

Figure 3:
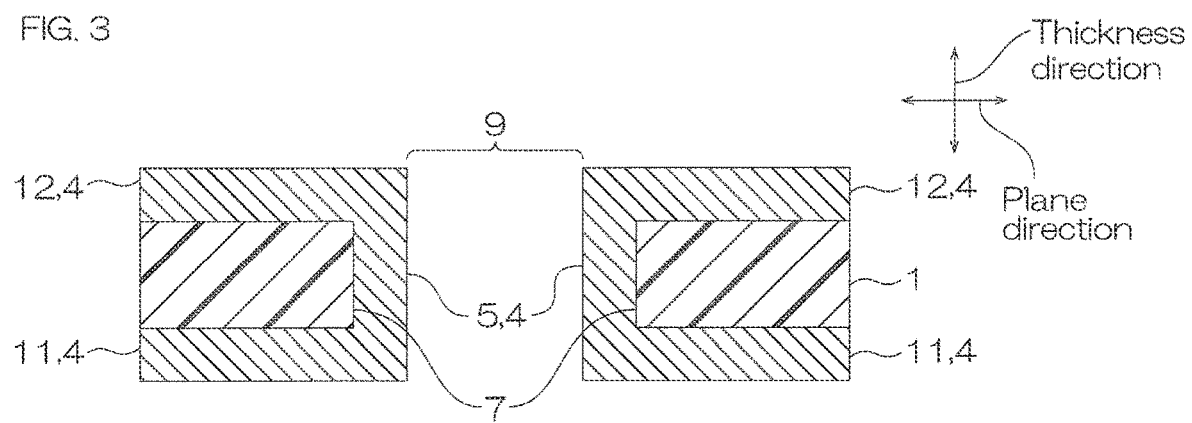
FIG. 3 shows a cross-sectional view of a metal layer laminate board in which a through hole is formed.

Next, as shown in FIG. 3, the metal layer laminate board 10 including the porous resin film 1 for a metal layer laminate board is described. The metal layer laminate board 10 includes the porous resin film 1 for a metal layer laminate board and a metal layer 4.

The porous resin film 1 for a metal layer laminate board includes the through hole 9. The through hole 9 penetrates the porous resin film 1 for a metal layer laminate board in the thickness direction. A shape and a dimension of the through hole 9 when viewed from the top are not particularly limited.

The metal layer 4 integrally includes the first metal layer 11, a second metal layer 12, and the electrically conductive portion 5.

The first metal layer 11 is disposed on the other surface in the thickness direction of the porous resin film 1 for a metal layer laminate board. Examples of a material for the first metal layer 11 include metals illustrated in the substrate film 2. As the material for the first metal layer 11, preferably, copper is used. The first metal layer 11 has a thickness of, for example, 0.1 μm or more, preferably 1 μm or more, and for example, 100 μm or less, preferably 50 μm or less.

The second metal layer 12 is disposed on one surface in the thickness direction of the porous resin film 1 for a metal layer laminate board. The second metal layer 12 may be disposed on one surface in the thickness direction of the porous resin film 1 for a metal layer laminate board through an adhesive layer which is not shown. Examples of a material for the first metal layer 11 include metals illustrated in the substrate film 2. Preferably, copper is used. The second metal layer 12 has a thickness of, for example, 0.1 μm or more, preferably 1 μm or more, and for example, 100 μm or less, preferably 50 μm or less.

The electrically conductive portion 5 is disposed on an inner peripheral surface 7 facing the through hole 9 in the porous resin film 1 for a metal layer laminate board. Specifically, the electrically conductive portion 5 is in contact with the inner peripheral surface 7. The electrically conductive portion 5 connects the first metal layer 11 to the second metal layer 12 facing the through hole 9. Thus, the electrically conductive portion 5 electrically connects the first metal layer 11 to the second metal layer 12. A material for the electrically conductive portion 5 is the same as that for the first metal layer 11. The electrically conductive portion 5 has a thickness of, for example, 1 μm or more, preferably 10 μm or more, and for example, 500 μm or less, preferably 250 μm or less. The thickness of the electrically conductive portion 5 is a length from the inner peripheral surface 7 toward the inside of the through hole 9.

A method for producing the metal layer laminate board 10 is described. First, a laminate 8 of the porous resin film 1 for a metal layer laminate board, the first metal layer 11, and the second metal layer 12 shown in FIG. 2 is prepared. When the material for the substrate film 2 is a metal, the substrate film 2 is not removed and subjected as it is as the first metal layer 11. On the other hand, the second metal layer 12 is disposed on one surface in the thickness direction of the porous resin film 1 for a metal layer laminate board. Thus, as shown in FIG. 2, the porous resin film 1 for a metal layer laminate board sandwiched between the first metal layer 11 and the second metal layer 12 in the thickness direction is obtained.

Thereafter, as shown in FIG. 3, the through hole 9 penetrating the laminate 8 in the thickness direction is formed. Examples of a method for forming the through hole 9 include drilling perforation and laser processing.

Thereafter, the electrically conductive portion 5 is, for example, formed on the inner peripheral surface 7 by plating. The electrically conductive portion 5 has a cylindrical shape or a columnar shape.

Thus, the metal layer laminate board 10 is produced.

Thereafter, the first metal layer 11 and the second metal layer 12 are formed into a pattern by etching and the like. Thereafter, the first metal layer 11 is, for example, electrically connected to another substrate (not shown) by reflow. A temperature in the reflow is, for example, 100° C. or more and 150° C. or less.

The metal layer laminate board 10 is, for example, used for wireless communication of the fifth generation (5G) standard, and a high-speed flexible printed board (FPC).

(Function and Effect of One Embodiment) In the porous resin film 1 for a metal layer laminate board, the ratio (Z/X) of the thermal expansion coefficient Z in the thickness direction with respect to the minimum thermal expansion coefficient X is as low as 3.5 or less. Therefore, it is possible to suppress a stress applied to the electrically conductive portion 5 (the metal layer 4 disposed on the inner peripheral surface 7 of the through hole 9) under the high temperature environment. Therefore, it is possible to suppress the above-described damage to the electrically conductive portion 5. The damage includes cracks and disconnections. As a result, it is possible to produce the metal layer laminate board 10 having excellent electrical connection reliability.

In the metal layer laminate board 10 shown in FIG. 3, the damage to the electrically conductive portion 5 is suppressed. Therefore, the metal layer laminate board 10 has excellent electrical connection reliability.

(Modified Examples) In each modified example below, the same reference numerals are provided for members and steps corresponding to each of those in the above-described one embodiment, and their detailed description is omitted. Each modified example can achieve the same function and effect as that of one embodiment unless otherwise specified. Furthermore, one embodiment and the modified example thereof can be appropriately used in combination.

EXAMPLES

Next, the present invention is further described based on Examples and Comparative Example below. The present invention is however not limited by these Examples and Comparative Example. The specific numerical values in mixing ratio (content ratio), property value, and parameter used in the following description can be replaced with upper limit values (numerical values defined as "or less" or "below") or lower limit values (numerical values defined as "or more" or "above") of corresponding numerical values in mixing ratio (content ratio), property value, and parameter described in the above-described "DESCRIPTION OF EMBODIMENTS".

Example 1

A reaction device equipped with a stirrer and a thermometer was charged with 71.37 g (0.66 mol) of PDA, 44.05 g (0.22 mol) of ODA, and 50.22 g (0.22 mol) of APAB; and 2300 g of an N-methyl-2-pyrrolidone (NMP) as a solvent was added thereto and stirred to prepare an NMP solution of PDA, ODA and APAB. The NMP solution contained 1.10 mol of a diamine component.

Next, 323.64 g (1.10 mol) of a 3,3'-4,4'-biphenyltetracarboxylic acid dianhydride (3,3'-4,4'-BPDA) was gradually added to the NMP solution of PDA, ODA, and APAB, furthermore, 331 g of an N-methyl-2-pyrrolidone (NMP) was added to increase the temperature to 80° C., and thereafter, the resulting mixture was stirred for 10 hours to obtain a polyimide precursor solution.

As a nucleating agent, 3 parts by mass of a PTFE powder having a median diameter of 1 μm or less; as a porosity forming agent, 200 parts by mass of a polyoxyethylene dimethyl ether having a weight average molecular weight of 400 (manufactured by NOF CORPORATION, grade: MM400); and 4 parts by mass of a 2-methylimidazole (manufactured by SHIKOKU CHEMICALS CORPORATION, 2 Mz-H) were added to 100 parts by mass of the solid content of the polyimide precursor solution to obtain a porous precursor solution. The porous precursor solution was applied to the substrate film 2 (the first metal layer 11) made of copper by a comma method to form a coating film. Subsequently, the coating film was dried at 120 to 160° C. for about seven minutes to fabricate a precursor film having a thickness of 50 μm.

By immersing the precursor film into carbon dioxide pressurized to 30 MPa at 60° C. and by circulating it for eight hours, extraction removal of the porosity forming agent, phase separation of the remaining NMP, and formation of pores were promoted. Thereafter, the carbon dioxide was reduced in pressure.

Thereafter, the precursor film was subjected to heat treatment at a temperature of 300° C. to 400° C. for about five hours under vacuum to promote removal and imidization of the remaining component, thereby obtaining the porous resin film 1 for a metal layer laminate board disposed on one surface in the thickness direction of the substrate film 2.

Thereafter, the substrate film 2 and the porous resin film 1 for a metal layer laminate board were immersed in a FeCl₃ solution, and the substrate film 2 was dissolved and removed. Thus, the porous resin film 1 for a metal layer laminate board was produced. A dielectric constant and a dielectric loss tangent at a frequency of 60 GHz of the porous resin film 1 for a metal layer laminate board were 1.51 and 0.002, respectively.

Example 2

The porous resin film 1 for a metal layer laminate board was produced in the same manner as in Example 1. However, the number of parts by mass of the polyoxyethylene dimethyl ether was changed from 200 parts by mass to 150 parts by mass. A dielectric constant and a dielectric loss tangent at a frequency of 60 GHz of the porous resin film 1 for a metal layer laminate board were 1.70 and 0.002, respectively.

Example 3

The porous resin film 1 for a metal layer laminate board was produced in the same manner as in Example 1. However, the number of parts by mass of the polyoxyethylene dimethyl ether was changed from 200 parts by mass to 50 parts by mass. A dielectric constant and a dielectric loss tangent at a frequency of 60 GHz of the porous resin film 1 for a metal layer laminate board were 2.00 and 0.002, respectively.

Comparative Example 1

A reaction device equipped with a stirrer and a thermometer was charged with 1444 g (13.36 mol) of PDA and 669 g (3.34 mol) of ODA; and 28534 g of NMP was added thereto and stirred to prepare an NMP solution of PDA and ODA. The NMP solution contained 16.70 mol of a diamine component.

Next, 4913 g (16.70 mol) of BPDA was gradually added to the solution, and furthermore, as a nucleating agent, 3 parts by mass of a PTFE powder having a median diameter of 1 μm or less and 6658 g of an N-methyl-2-pyrrolidone (NMP) were added thereto and stirred at 25° C. for three hours. The temperature of the resulting mixture was increased to 80° C. to be then stirred for 20 hours, thereby obtaining a polyimide precursor solution.

As a porosity forming agent, 200 parts by mass of a polyoxyethylene dimethyl ether having a weight average molecular weight of 400 (manufactured by NOF CORPORATION, grade: MM400); 4 parts by mass of a 2-methylimidazole (manufactured by SHIKOKU CHEMICALS CORPORATION, 2 Mz-H), and 5091 parts by mass of an N-methyl-2-pyrrolidone (NMP) were added to 100 parts by mass of the solid content of the polyimide precursor solution to be stirred, thereby obtaining a uniform solution. The solution was applied to a copper foil by a die method to be dried at 120° C. for seven minutes, thereby fabricating a precursor film having a phase separation structure having a thickness of about 60 μm.

By immersing the precursor film into carbon dioxide pressurized to 30 MPa at 60° C. and by circulating it for eight hours, extraction removal of the polyoxyethylene dimethyl ether, phase separation of the remaining NMP, and formation of pores were promoted. Thereafter, the carbon dioxide was reduced in pressure.

Subsequently, the precursor film was subjected to heat treatment at a temperature of 300° C. to 400° C. for about five hours under vacuum to promote removal and imidization of the remaining component, thereby obtaining the porous resin film 1 for a metal layer laminate board disposed on one surface in the thickness direction of the first metal layer 11.

Thereafter, the first metal layer 11 and the porous resin film 1 for a metal layer laminate board were immersed in a FeCl₃ solution, and the first metal layer 11 was dissolved and removed. Thus, the porous resin film 1 for a metal layer laminate board was produced. A dielectric constant and a dielectric loss tangent at a frequency of 60 GHz of the porous resin film 1 for a metal layer laminate board were 1.51 and 0.006, respectively.

A mole fraction of each of the third diamines (APAB) of Examples and Comparative Example, and the mixing number of parts by mass of the porosity forming agent are described in Table 1.

<Evaluation>

The following items were evaluated for each of the porous resin films 1 for a metal layer laminate board of Examples and Comparative Example. The results are described in Table 1.

(Porosity of Porous Resin Film 1 for Metal Layer Laminate Board) A porosity of the porous resin film 1 for a metal layer laminate board was determined by calculation based on the following formula.

Dielectric constant of the porous resin film 1 for a metal layer laminate board=dielectric constant of air×porosity+ dielectric constant of polyimide×(1−porosity)

Since the dielectric constant of the air is 1, and the dielectric constant of the polyimide is 3.5:

Dielectric constant of the porous resin film 1 for a metal layer laminate board=porosity+3.5 (1−porosity)

Porosity=(3.5−dielectric constant of the porous resin film 1 for a metal layer laminate board)/2.5

Porosity (%)=[(3.5−dielectric constant of the porous resin film 1 for a metal layer laminate board)/2.5]×100

(Minimum Thermal Expansion Coefficient X of Porous Resin Film 1 for Metal Layer Laminate Board)

The porous resin film 1 for a metal layer laminate board was cut into a size of 4 mm× 40 mm to fabricate a sample. The sample was set in a thermomechanical analyzer (manufactured by TA Instruments, TMA Q400), and the temperature thereof was increased from 0° C. to 200° C. at a temperature rising rate of 2.0° C./min, while a load of 0.01 N was applied to the sample in the plane direction. The sample was then cooled from 200° C. to 0° C. at a temperature lowering rate of 5.0° C./min. Thereafter, the temperature thereof was increased from 0° C. to 200° C. at a temperature rising rate of 2.0° C./min, and an average thermal expansion coefficient from 0° C. to 200° C. was determined. For the plurality of plane directions, the above-described average thermal expansion coefficient was determined, and of these, the minimum value was determined as the minimum thermal expansion coefficient X.

(Thermal Expansion Coefficient Z in Thickness Direction of Porous Resin Film 1 for Metal Layer Laminate Board)

The porous resin film 1 for a metal layer laminate board was cut into a size of 5 mm× 5 mm to fabricate a sample. The sample was set in a laser thermal expansion meter (manufactured by ULVAC-RIKO Inc., laser thermal expansion meter LIX-1 type), and measurement was started after subjecting the sample to a preheat treatment at 200° C. The measurement was carried out under the equal rate temperature rising conditions of 2° C./min and in helium, a sample in the thickness direction was measured, while about 17 g of a load was applied in the thickness direction within a temperature range of −65° C. to 200° C.

Each of the calculation formulas of the minimum thermal expansion coefficient X and the thermal expansion coefficient Z described above was as follows:

T: temperature (25° C.)
L0: sample length at 25° C.
L: expansion amount from a reference temperature
L/L0: linear expansion coefficient from a reference temperature to each temperature Thermal expansion coefficient=$\{(\Delta L/L0)T1-(\Delta L/L0)T2\}/(T1-T2)$ <Damage to Electrically Conductive Portion>

A through hole was formed in the porous resin film 1 for a metal layer laminate board by drilling perforation. The through hole had a circular shape when viewed from the top, and its diameter was 300 μm. Thereafter, a sample was prepared by forming the electrically conductive portion 5 made of copper on the inner peripheral surface of the through hole by electroless copper plating and electrolytic copper plating. The electrically conductive portion 5 had a thickness of 10 μm.

A resistance value of the sample was measured during a temperature cycle test (thermal cycle test going between −65° C. and 150° C.), and a crack in the electrically conductive portion 5 was detected. The damage to the electrically conductive portion 5 was evaluated by the following criteria.

<Criteria>

Excellent: a crack did not occur in the electrically conductive portion 5 by 2000 cycles.

Good: a crack occurred in the electrically conductive portion 5 above 1000 cycles and within 2000 cycles.

Bad: a crack occurred in the electrically conductive portion 5 by 1000 cycles.

TABLE 1

|  |  | Ex. 1 | Ex. 2 | Ex. 3 | Comparative Ex. 1 |
|---|---|---|---|---|---|
| Third Diamine (APAB) (mol %) |  | 20 | 20 | 20 | — |
| Porosity Forming Agent (Polyoxyethylene Dimethyl Ether) (parts by mass to 100 parts by mass of Polyimide Resin Precursor) |  | 200 | 150 | 50 | 200 |
| Evaluation of Porous Resin Film for Metal Layer Laminate Board | Porosity (%) | 80 | 70 | 60 | 80 |
|  | Minimum Thermal Expansion Coefficient X (ppm/K) | 23.3 | 25.0 | 22.3 | 23.0 |
|  | Thermal Expansion Coefficient Z in Thickness Direction (ppm/K) | 61.0 | 55.0 | 75.0 | 91.0 |
|  | Thermal Expansion Coefficient Z in Thickness Direction/Minimum Thermal Expansion Coefficient X | 2.6 | 2.2 | 3.4 | 4.0 |
| Evaluation of Metal Layer Laminate Board | Damage to Electrically Conductive Portion in Through Hole | Excellent | Excellent | Good | Bad |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

DESCRIPTION OF REFERENCE NUMERALS

X Minimum thermal expansion coefficient
Z Thermal expansion coefficient

The invention claimed is:

1. A porous polyimide resin film for a metal layer laminate board used in lamination of a metal layer having
  a minimum thermal expansion coefficient X in a plane direction perpendicular to a thickness direction and a thermal expansion coefficient Z in the thickness direction,
  wherein the porous polyimide resin film is a reaction product of a diamine component and an acid dianhydride component,
  wherein the diamine component includes a plurality of aromatic rings and an ester bond disposed between the aromatic rings, and
  wherein a ratio (Z/X) of the thermal expansion coefficient Z in the thickness direction to the minimum thermal expansion coefficient X is 3.5 or less.

2. A metal layer laminate board comprising:
  the porous polyimide resin film for a metal layer laminate board having a through hole penetrating in a thickness direction and according to claim 1 and
  a metal layer disposed on one surface and the other surface in the thickness direction of the porous polyimide resin film for a metal layer laminate board and an inner peripheral surface of the through hole.

\* \* \* \* \*